(12) United States Patent
Ramsdale

(10) Patent No.: US 7,877,528 B2
(45) Date of Patent: *Jan. 25, 2011

(54) SYSTEM METHOD FOR I/O PADS IN MOBILE MULTIMEDIA PROCESSOR (MMP) THAT HAS BYPASS MODE WHEREIN DATA IS PASSED THROUGH WITHOUT BEING PROCESSED BY MMP

(75) Inventor: Timothy James Ramsdale, Cambridge (GB)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/628,864

(22) Filed: Dec. 1, 2009

(65) Prior Publication Data

US 2010/0087147 A1 Apr. 8, 2010

Related U.S. Application Data

(63) Continuation of application No. 11/335,801, filed on Jan. 19, 2006, now Pat. No. 7,640,379.

(60) Provisional application No. 60/652,428, filed on Feb. 12, 2005.

(51) Int. Cl.
- G06F 13/00 (2006.01)
- G06F 3/00 (2006.01)
- H04J 3/12 (2006.01)

(52) U.S. Cl. ............... 710/38; 710/14; 710/16; 710/33; 710/316; 455/566; 455/565; 370/522

(58) Field of Classification Search ............ 710/14, 710/16, 33, 38, 316; 455/565, 566; 370/522
See application file for complete search history.

(56) References Cited

U.S. PATENT DOCUMENTS

| | | | | |
|---|---|---|---|---|
| 6,526,742 B1 * | 3/2003 | Ausserwoger et al. | ... | 60/39.094 |
| 6,937,144 B2 * | 8/2005 | Drake et al. | ................ | 340/447 |
| 7,233,807 B2 * | 6/2007 | Lim | ....................... | 455/556.1 |
| 7,245,945 B2 * | 7/2007 | Paver et al. | ................. | 455/574 |
| 7,446,433 B2 * | 11/2008 | Masciarelli et al. | .......... | 307/66 |
| 7,643,731 B2 * | 1/2010 | Kobayashi et al. | ......... | 386/125 |
| 2006/0079270 A1 * | 4/2006 | Kim et al. | ................ | 455/550.1 |

* cited by examiner

*Primary Examiner*—Tammara Peyton
(74) *Attorney, Agent, or Firm*—McAndrews, Held & Malloy, Ltd.

(57) ABSTRACT

Methods and systems for input/output pads in a mobile multimedia processor are disclosed and may include receiving data from a host device in an integrated circuit having at least one contact pad and generating at least one control signal that controls the contact pads. The received data may be processed by the MMP based on the generated at least one control signal, or may be passed through the MMP in a bypass mode based on the control signal, thereby allowing the received data to pass through the MMP without processing to an external memory via the at least one contact pad, thereby sharing the external memory with the host device. The data may be transferred to external memory coupled to a contact pad on the MMP when the received data is to be passed through the MMP. The received data may be stored temporarily before transfer to an external device.

16 Claims, 17 Drawing Sheets

SYSTEM METHOD FOR I/O PADS IN MOBILE MULTIMEDIA PROCESSOR (MMP) THAT HAS BYPASS MODE WHEREIN DATA IS PASSED THROUGH WITHOUT BEING PROCESSED BY MMP

CROSS-REFERENCE TO RELATED APPLICATIONS/INCORPORATION BY REFERENCE

This application is a continuation of U.S. application Ser. No. 11/335,801 filed Jan. 19, 2006, now U.S. Pat. No. 7,640,379, which makes reference to, claims priority to, and claims the benefit of U.S. Provisional Patent Application Ser. No. 60/652,428 filed Feb. 12, 2005.

This application makes reference to:

U.S. patent application Ser. No. 11/335,800 filed on Jan. 19, 2006;

U.S. patent application Ser. No. 11/302,930 filed on Dec. 14, 2005;

U.S. patent application Ser. No. 11/318,980 filed on Dec. 27, 2005;

U.S. patent application Ser. No. 11/300,388 filed on Dec. 14, 2005;

U.S. patent application Ser. No. 11/332,892 filed on Jan. 17, 2006; and

U.S. patent application Ser. No. 11/335,026 filed on Jan. 19, 2006.

Each of the above stated applications is hereby incorporated herein by reference in its entirety.

FIELD OF THE INVENTION

Certain embodiments of the invention relate to the processing of multimedia information. More specifically, certain embodiments of the invention relate to a method and system for input/output pads in a mobile multimedia processor.

BACKGROUND OF THE INVENTION

Mobile communications have changed the way people communicate and mobile phones have been transformed from a luxury item to an essential part of every day life. The use of mobile phones today is dictated by social situations, rather than hampered by location or technology. While voice connections fulfill the basic need to communicate, and mobile voice connections continue to filter even further into the fabric of every day life, various integrated mobile multimedia applications, utilizing the mobile Internet, may be the next step in the mobile communication revolution.

Third generation and/or intermediate generation, also referred to as 3G and 2.5G respectively, for example, cellular networks offering various high speed access technologies and mobile telephones that have been specifically designed to utilize these technologies, fulfill demands for integrated multimedia applications supporting TV and audio applications utilizing advanced compression standards, high-resolution gaming applications, musical interfaces, peripheral interface support, etc. The processing requirements are being increased as chip designers take advantage of compression and higher bandwidths to transmit more information. 3G wireless applications support bit rates from 384 kilobits (Kbits)/second to 2 megabits (Mbits)/second, allowing chip designers to provide wireless systems with multimedia capabilities, superior quality, reduced interference, and a wider coverage area.

As mobile multimedia services grow in popularity and usage, factors such as power consumption, cost efficient optimization of network capacity and quality of service (QoS) will become even more essential to cellular operators than it is today. These factors may be achieved with careful network planning and operation, improvements in transmission methods, and advances in receiver techniques and chip integration solutions. To this end, carriers need technologies that will allow them to increase downlink throughput for the mobile multimedia applications support and, in turn, offer advanced QoS capabilities and speeds for consumers of mobile multimedia application services. Currently, mobile multimedia processors may not fully utilize system-on-a-chip (SOC) integration for advanced total system solution for today's mobile handsets. For example, conventional mobile processors may utilize a plurality of hardware accelerators to enable a variety of multimedia applications, which significantly increases power consumption, implementation complexity, mobile processor real estate, and ultimately terminal size.

However, when host processors interface with multimedia accelerators, assuring the integrity and/or compatibility of control signals may be necessary. This may be important when, for example, the host processor operates at high speeds and noise, glitches, and/or delays in control signals from the host processor to the multimedia accelerator may result in false bus cycles and/or other operating errors. These errors may degrade the quality of the data, video, and/or audio content generated by the multimedia accelerator. Moreover, because the host processor may interface with other devices through the multimedia accelerator, the multimedia accelerator may also require sufficient architectural flexibility to accommodate various modes of operation.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for input/output pads in a mobile multimedia processor, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for input/output pads in a mobile multimedia processor. Input, output, and/or bidirectional pads in a host bus interface and/or a slave bus interface may be configured to provide bypass capabilities when a mobile multimedia processor is powered down or hibernating. The pads may be adapted to provide pull-up and pull-down capabilities. The pull-up and pull-down capabilities may be dynamically programmed. This approach provides a flexible architecture that enables high-speed bypass operations between a host processor and peripheral devices via a mobile multimedia processor.

Figure 1A:
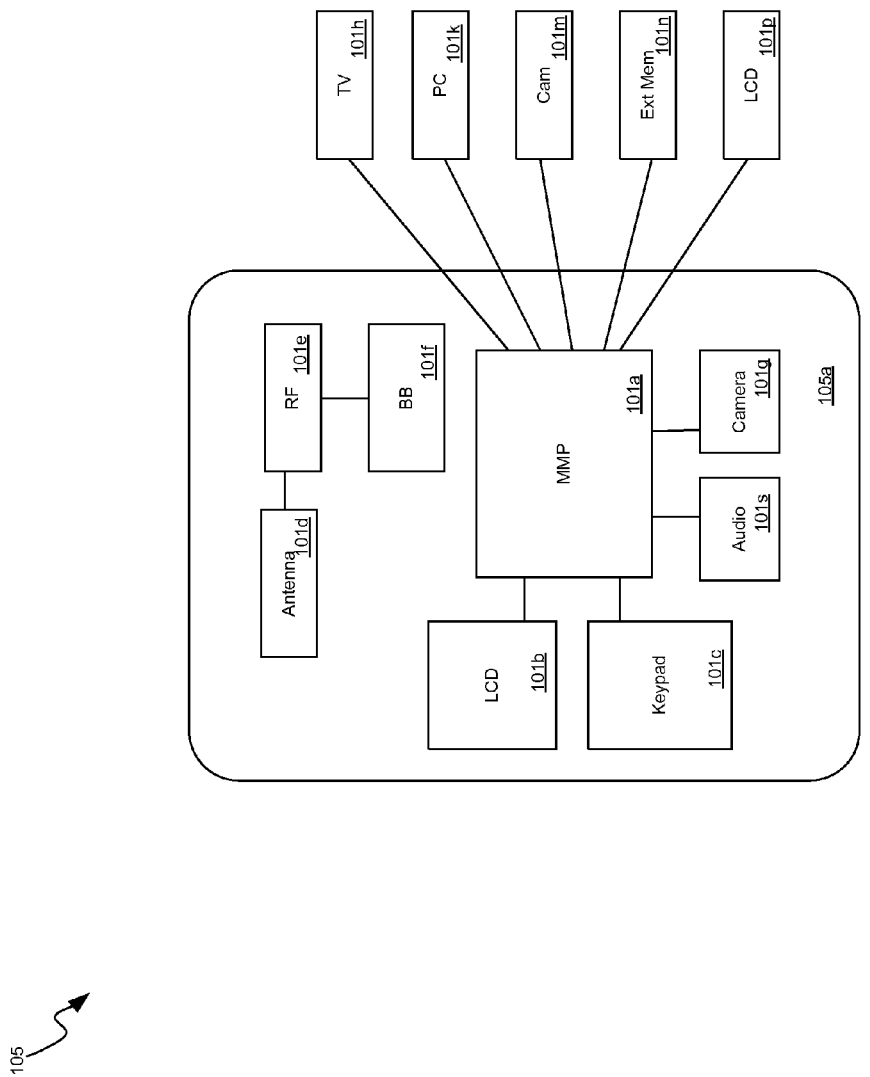
FIG. 1A is a block diagram of an exemplary mobile multimedia system, in accordance with an embodiment of the invention.

FIG. 1A is a block diagram of an exemplary mobile multimedia system, in accordance with an embodiment of the invention. Referring to FIG. 1A, there is shown a mobile multimedia system 105 that comprises a mobile multimedia device 105a, a TV 101h, a PC 101k, an integrable camera 101m, external memory 101n, and an integrable LCD display 101p. The mobile multimedia device 105a may be a cellular telephone or other handheld communication device. The mobile multimedia device 105a may comprise a mobile multimedia processor (MMP) 101a, an antenna 101d, an audio block 101s, a radio frequency (RF) block 101e, a baseband processing block 101f, an LCD display 101b, a keypad 101c, and a camera 101g.

The MMP 101a may comprise suitable circuitry, logic, and/or code and may be adapted to perform video and/or multimedia processing for the mobile multimedia device 105a. The MMP 101a may further comprise a plurality of integrated interfaces, which may be utilized to support one or more external devices coupled to the mobile multimedia device 105a. For example, the MMP 101a may support connections to a TV 101h, a PC 101k, an integrable camera 101m, external memory 101n, and an integrable LCD display 101p.

In operation, the mobile multimedia device may receive signals via the antenna 101d. Received signals may be processed by the RF block 101e and the RF signals may be converted to baseband by the baseband processing block 101f. Baseband signals may then be processed by the MMP 101a. Audio and/or video signals may also be received via the integrated camera 101g, the TV 101h, the PC 101k, and/or the integrable camera 101m. During processing, the MMP 101a may utilize the external memory 101n for storing of processed data. Processed audio data may be communicated to the audio block 101s and processed video data may be communicated to the LCD 101b or the TV 101h, for example. The keypad 101c may be utilized for communicating processing commands and/or other data, which may be required for audio or video data processing by the MMP 101a.

Figure 1B:
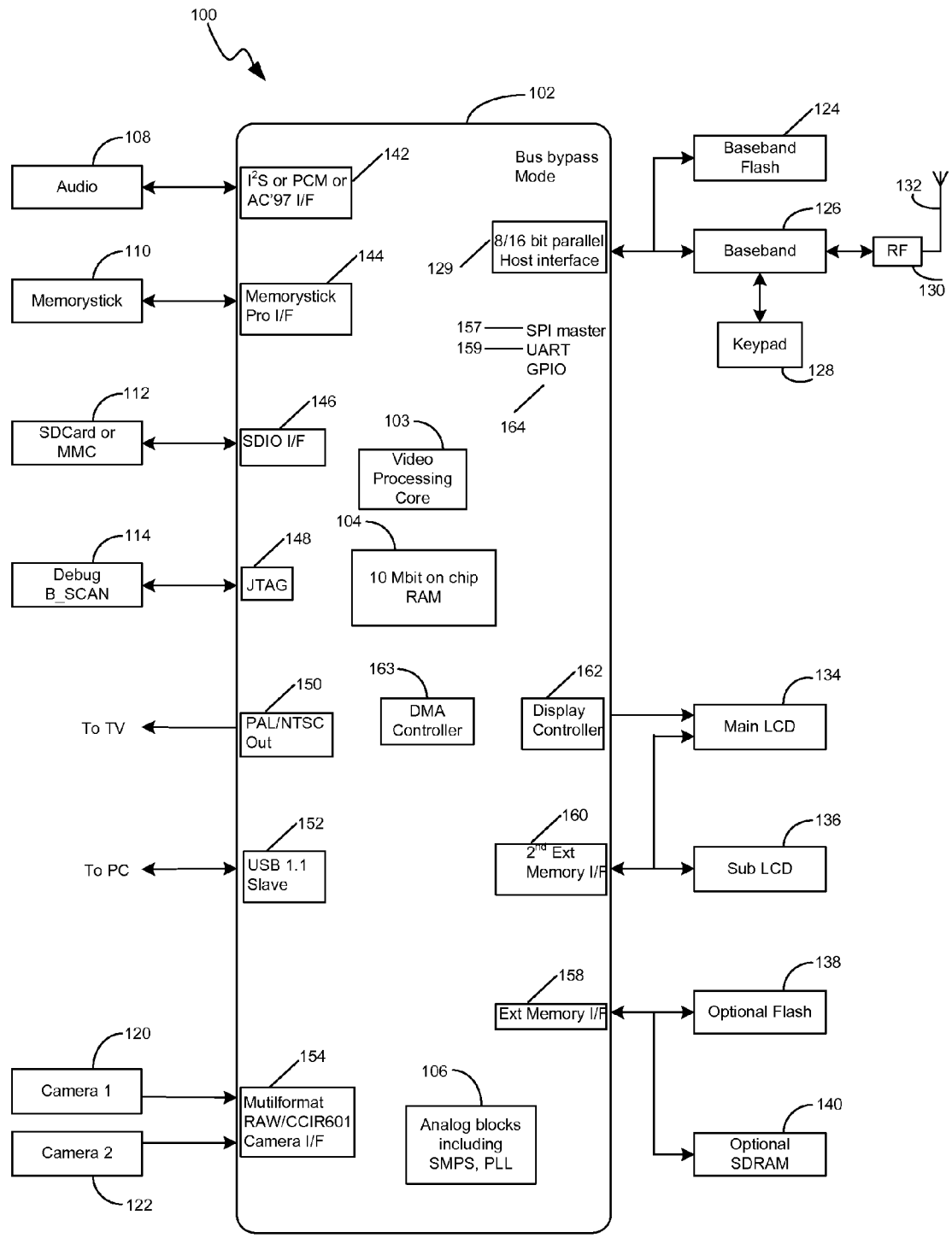
FIG. 1B is a block diagram of an exemplary mobile multimedia processor, in accordance with an embodiment of the invention.

FIG. 1B is a block diagram of an exemplary mobile multimedia processor, in accordance with an embodiment of the invention. Referring to FIG. 1B, the mobile multimedia processor 102 may comprise suitable logic, circuitry and/or code that may be adapted to perform video and/or multimedia processing for handheld multimedia products. For example, the mobile multimedia processor 102 may be designed and optimized for video record/playback, mobile TV and 3D mobile gaming, utilizing integrated peripherals and a video processing core. The mobile multimedia processor 102 may comprise a video processing core 103, RAM 104, an analog block 106, a direct memory access (DMA) controller 163, an audio interface (I/F) 142, a memory stick I/F 144, SD card I/F 146, JTAG I/F 148, TV output I/F 150, USB I/F 152, a camera I/F 154, and a host I/F 129. The mobile multimedia processor 102 may further comprise a serial peripheral interface (SPI) 157, a universal asynchronous receiver/transmitter (UART) I/F 159, general purpose input/output (GPIO) pins 164, a display controller 162, an external memory I/F 158, and a second external memory I/F 160.

The video processing core 103 may comprise suitable circuitry, logic, and/or code and may be adapted to perform video processing of data. The RAM 104 may comprise suitable logic, circuitry and/or code that may be adapted to store on-chip data such as video data. In an exemplary embodiment of the invention, the RAM 104 may be adapted to store 10 Mbits of on-chip data, for example. The size of the on-chip RAM 104 may vary depending on cost or other factors such as chip size.

The analog block 106 may comprise a switch mode power supply (SMPS) block and a phase locked loop (PLL) block. In addition, the analog block 106 may comprise an on-chip SMPS controller, which may be adapted to generate its core voltage. The core voltage may be software programmable according to, for example, speed demands on the mobile multimedia processor 102, allowing further control of power management.

In an exemplary embodiment of the invention, the normal core operating range may be about 0.8 V-1.2 V and may be reduced to about 0.6 V during hibernate mode. The analog block 106 may also comprise a plurality of PLL's that may be adapted to generate about 195 kHz-200 MHz clocks, for example, for external devices. Other voltages and clock speeds may be utilized depending on the type of application. The mobile multimedia processor 102 may comprise a plurality of power modes of operation, for example, run, sleep, hibernate and power down. In accordance with an embodiment of the invention, the mobile multimedia processor 102 may comprise a bypass mode that may allow a host to access memory mapped peripherals in power down mode, for example. In bypass mode, the mobile multimedia processor 102 may be adapted to directly control the display during normal operation while giving a host the ability to maintain the display during standby mode.

The audio block 108 may comprise suitable logic, circuitry and/or code that may be adapted to communicate with the mobile multimedia processor 102 via an inter-IC sound ($I^2S$), pulse code modulation (PCM) or audio codec (AC'97) interface 142 or other suitable interface, for example. In the case of an AC'97 and/or an $I^2S$ interface, suitable audio controller, processor and/or circuitry may be adapted to provide AC'97 and/or $I^2S$ audio output respectively, in either master or slave mode. In the case of the PCM interface, a suitable audio controller, processor and/or circuitry may be adapted to allow input and output of telephony or high quality stereo audio. The PCM audio controller, processor and/or circuitry may comprise independent transmit and receive first in first out (FIFO) buffers and may use DMA to further reduce processor overhead. The audio block 108 may also comprise an audio in, audio out port and a speaker/microphone port (not illustrated in FIG. 1B).

The mobile multimedia device 100 may comprise at least one portable memory input/output (I/O) block. In this regard, the memorystick block 110 may comprise suitable logic, circuitry and/or code that may be adapted to communicate with the mobile multimedia processor 102 via a memorystick pro interface 144, for example. The SD card block 112 may comprise suitable logic, circuitry and/or code that may be adapted to communicate with the mobile multimedia processor 102 via a SD card interface 146, for example. A multimedia card (MMC) may also be utilized to communicate with the mobile multimedia processor 102 via the SD card interface 146, for example. The mobile multimedia device 100 may comprise other portable memory I/O blocks such an xD I/O card.

The debug block 114 may comprise suitable logic, circuitry and/or code that may be adapted to communicate with the mobile multimedia processor 102 via a joint test action group (JTAG) interface 148, for example. The debug block 114 may be adapted to access the address space of the mobile multimedia processor 102 and may be adapted to perform boundary scan via an emulation interface. Other test access ports (TAPs) may be utilized. The phase alternate line (PAL)/national television standards committee (NTSC) TV output I/F 150 may be utilized for communication with a TV, and the universal serial bus (USB) 1.1, or other variant thereof, slave port I/F 152 may be utilized for communications with a PC, for example. The cameras 120 and/or 122 may comprise suitable logic, circuitry and/or code that may be adapted to communicate with the mobile multimedia processor 102 via a multiformat raw CCIR 601 camera interface 154, for example. The camera I/F 154 may utilize windowing and sub-sampling functions, for example, to connect the mobile multimedia processor 102 to a mobile TV front end.

The SPI master interface 157 may comprise suitable circuitry, logic, and/or code and may be utilized to control image sensors. Two chip selects may be provided, for example, to work in a polled mode with interrupts or via a DMA controller 163. Furthermore, the mobile multimedia processor 102 may comprise a plurality of general purpose I/O (GPIO) pins 164, which may be utilized for user defined I/O or to connect to the internal peripherals. The display controller 162 may comprise suitable circuitry, logic, and/or code and may be adapted to support multiple displays with up to XGA resolution, for example, and to handle 8/9/16/18/21-bit video data.

The baseband flash memory 124 may be adapted to receive data from the mobile multimedia processor 102 via an 8/16 bit parallel host interface 129, for example. The host interface 129 may be adapted to provide two channels with independent address and data registers through which a host processor may read and/or write directly to the memory space of the mobile multimedia processor 102. The baseband processing block 126 may comprise suitable logic, circuitry and/or code that may be adapted to convert RF signals to baseband and communicate the baseband processed signals to the mobile multimedia processor 102 via the host interface 129, for example. The RF processing block 130 may comprise suitable logic, circuitry and/or code that may be adapted to receive signals via the antenna 132 and to communicate RF signals to the baseband processing block 126. The host interface 129 may comprise a dual software channel with a power efficient bypass mode.

The main LCD 134 may be adapted to receive data from the mobile multimedia processor 102 via a display controller 162 and/or from a second external memory interface 160, for example. The display controller 162 may comprise suitable logic, circuitry and/or code and may be adapted to drive an internal TV out function or be connected to a range of LCD's. The display controller 162 may be adapted to support a range of screen buffer formats and may utilize direct memory access (DMA) to access the buffer directly and increase video processing efficiency of the video processing core 103. Both NTSC and PAL raster formats may be generated by the display controller 162 for driving the TV out. Other formats, for example SECAM, may also be supported In one embodiment of the invention, the display controller 162 may be adapted to support a plurality of displays, such as an interlaced display, for example a TV, and/or a non-interlaced display, such as an LCD. The display controller 162 may also recognize and communicate a display type to the DMA controller 163. In this regard, the DMA controller 163 may fetch video data in an interlaced or non-interlaced fashion for communication to an interlaced or non-interlaced display coupled to the mobile multimedia processor 102 via the display controller 162.

The substitute LCD 136 may comprise suitable logic, circuitry and/or code that may be adapted to communicate with the mobile multimedia processor 102 via a second external memory interface, for example. The mobile multimedia processor 102 may comprise a RGB external data bus. The mobile multimedia processor 102 may be adapted to scale image output with pixel level interpolation and a configurable refresh rate.

The optional flash memory 138 may comprise suitable logic, circuitry and/or code that may be adapted to communicate with the mobile multimedia processor 102 via an external memory interface 158, for example. The optional SDRAM 140 may comprise suitable logic, circuitry and/or code that may be adapted to receive data from the mobile multimedia processor 102 via the external memory interface 158, for example. The external memory I/F 158 may be utilized by the mobile multimedia processor 102 to connect to external SDRAM 140, SRAM, Flash memory 138, and/or external peripherals, for example. Control and timing information for the SDRAM 140 and other asynchronous devices may be configurable by the mobile multimedia processor 102.

The mobile multimedia processor 102 may further comprise a secondary memory interface 160 to connect to connect to memory-mapped LCD and external peripherals, for example. The secondary memory interface 160 may comprise suitable circuitry, logic, and/or code and may be utilized to connect the mobile multimedia processor 102 to slower devices without compromising the speed of external memory access. The secondary memory interface 160 may provide 16 data lines, for example, 6 chip select/address lines, and programmable bus timing for setup, access and hold times, for example. The mobile multimedia processor 102 may be adapted to provide support for NAND/NOR Flash including NAND boot and high speed direct memory access (DMA), for example.

In operation, the mobile multimedia processor 102 may be adapted to support multiple display formats for displaying processed video data. For example, interlaced and/or non-interlaced external displays may be connected to the mobile multimedia processor 102 via the display controller 162. The software operating in the mobile multimedia processor 102 may communicate the external display type to the DMA controller 163. The DMA controller 163 may then access the on-chip RAM 104 and may fetch processed video data in an interlaced or non-interlaced format, corresponding to the external display type.

Figure 2:
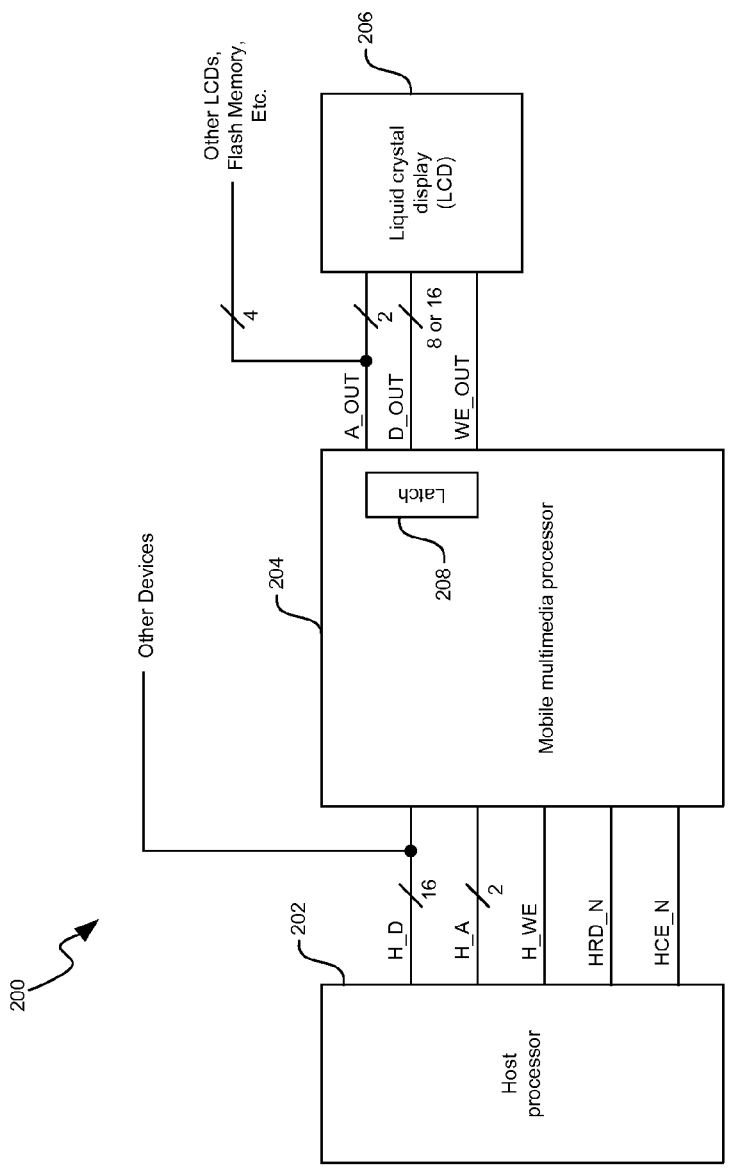
FIG. 2 shows an exemplary system for host and peripheral interfaces in a mobile multimedia processor, in accordance with an embodiment of the invention.

FIG. 2 shows an exemplary system for host and peripheral interfaces in a mobile multimedia processor, in accordance with an embodiment of the invention. Referring to FIG. 2 there is shown a system 200 that may comprise a host processor 202, mobile multimedia processor 204, and a liquid crystal display (LCD) 206. The mobile multimedia processor 204 may comprise a latch 208. The host processor 202 may comprise suitable logic, circuitry, and/or code that may be adapted to control a portion of the operations of the mobile multimedia processor 204. The host processor 202 may also be adapted to transfer data to the mobile multimedia processor 204.

The mobile multimedia processor 204 may comprise suitable logic, circuitry, and/or code that may be adapted to perform video and/or multimedia processing for handheld multimedia products. The operation of the mobile multimedia processor 204 may be substantially as illustrated by the mobile multimedia processor 102 in FIG. 1B. Moreover, the mobile multimedia processor 204 may operate in a processing mode or in a bypass mode, for example. In the processing mode, information or signals transferred to the mobile multimedia processor 204 are processed by the mobile multimedia processor 204. In the bypass mode of operation, information or signals transferred to the mobile multimedia processor 204 are passed through the mobile multimedia processor 204 without being processed. The latch 208 may comprise suitable logic, circuitry, and/or code that may be adapted to transfer data to a peripheral device, such as the LCD 206.

The host interface between the host processor 202 and the mobile multimedia processor 204 may comprise a host data signal, H_D, a host address signal, H_A, a host read select signal, HRD_N, a host chip select signal, HCE_N, and a host write enable signal, H_WE. The peripheral interface between the LCD 206 and the mobile multimedia processor 204 may comprise a data out signal, D_OUT, an address out signal, A_OUT, and a write enable out signal, WE_OUT.

The H_D signal may comprise a plurality of bits of binary information, for example 16 bits, which may be communicated between the host processor 202 and the mobile multimedia processor 204. The H_D signal may also be communicated to other devices in a mobile multimedia device. The H_A signal may comprise a plurality of binary address bits, for example 3 bits, which may be communicated between the host processor 202 and the mobile multimedia processor 204. The H_WE signal may comprise a write enable signal that may be communicated between the host processor 202 and the mobile multimedia processor 204.

The A_OUT signal may comprise a plurality of binary address bits, for example 6 bits, which may be communicated between the mobile multimedia processor 204 and the LCD 206. A plurality of bits from the A_OUT signal, for example at least 4 bits, may be communicated to other devices such as LCDs and/or flash memory, for example. The D_OUT signal may comprise a plurality of bits of binary information, for example 8 bits or 16 bits, which may be communicated between the mobile multimedia processor 204 and to the LCD 206. The WE_OUT signal may comprise a write enable signal that may be communicated between the mobile multimedia processor 204 and the LCD 206. The signals A_OUT, D_OUT, and WE_OUT may be communicated to the LCD 206 by the mobile multimedia processor 204 via a latch 208, for example.

In operation, when the mobile multimedia processor 204 operates in a processing mode, information communicated or transferred from the host processor 202 may be processed by the mobile multimedia processor 204 before being communicated or transferred to a peripheral device, such as the LCD 206. In this regard, the host processor 202 may communicate data, via the signal H_D, to the mobile multimedia processor 204 that is to be written to a location based on the address signal H_A that may also be communicated by the host processor 202 to the mobile multimedia processor 204. The host processor 202 may also enable the mobile multimedia processor 204, via the signal H_WE, to store the data, communicated in the signal H_D, at a location based on the address signal H_A. The mobile multimedia processor 204 may perform a series of processing steps on the data received via the signal H_D, and communicate a resultant output to, for example, the LCD 206. The output may be stored in a latch 208 prior to being communicated to the LCD 206. The output presented by the latch may comprise output data, which is communicated to the LCD 206 via the signal D_OUT, an output address, which is communicated to the LCD 206 via the signal A_OUT, and a write enable signal, which is communicated to the LCD 206 via the signal WE_OUT. The WE_OUT signal may enable the LCD 206 to store the data, communicated in the signal D_OUT, at a location based on the address signal A_OUT.

Figure 3A:
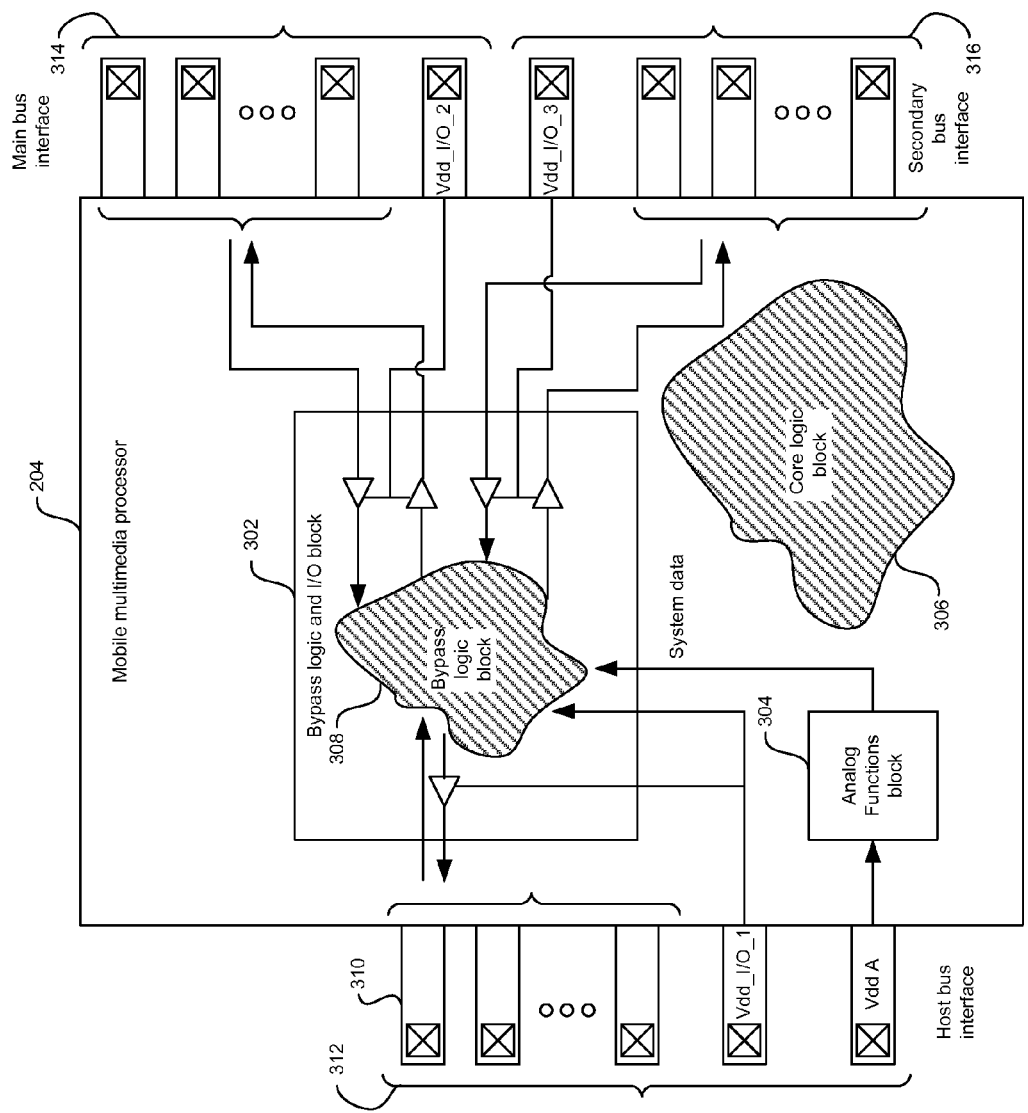
FIG. 3A is a block diagram of an exemplary bypass logic system in a mobile multimedia processor, in accordance with an embodiment of the invention.

FIG. 3A is a block diagram of an exemplary bypass logic system in a mobile multimedia processor, in accordance with an embodiment of the invention. Referring to FIG. 3A the mobile multimedia processor 204 in FIG. 2 may comprise a bypass logic and input/output (I/O) block 302, an analog functions block 304, a core logic block 306, and a plurality of pads 310. The bypass logic and input/output (I/O) block 302 may comprise a bypass logic block 308.

The plurality of pads 310 may comprise suitable logic, and/or circuitry that may be integrated on the mobile multimedia processor 204 and that may be adapted to interface internal circuitry within the mobile multimedia processor 204 to external circuitry. The plurality of pads 310 may be grouped into a host interface bus 312, a main bus interface 314, and a secondary bus interface 316. The host bus associated with the host bus interface 312 may be referred to as a master bus while the main bus associated with the main bus interface 314 and the secondary bus associated with the secondary bus interface 316 may be referred to as slave busses. The data transfer operations associated with the host bus interface 312 may utilize a Vdd_I/O_1 supply voltage, the data transfer operations associated with the main bus interface 314 may utilize a Vdd_I/O_2 supply voltage, and the data transfer operations associated with the secondary bus interface 316 may utilize a Vdd_I/O_3 supply voltage. The signals transferred to and from the slave buses may be level shifted, for example. The Vdd_I/O_1 supply voltage, the Vdd_I/O_2 supply voltage, and the Vdd_I/O_3 supply voltage may be provided via at least one of the pads 310.

The bypass logic and I/O block 302 may comprise suitable logic, circuitry, and/or code that may be adapted to support the bypass mode of operation in the mobile multimedia processor 204. In this regard, the bypass logic and I/O block 302 may utilize the bypass logic block 308 and, in some instances, logic and/or circuitry associated with the plurality of pads 310. The bypass logic and I/O block 302 may utilize a supply voltage, such as the Vdd_I/O_1 voltage in the host interface bus 312, to provide power to the bypass logic block 308. In some embodiments of the mobile multimedia processor 204, the bypass logic and I/O block 302 may be located closer to the pads in the host bus interface 312 than to the pads in the main bus interface 314 or the pads in the secondary bus interface 316. The operations of the bypass logic and I/O block 302 may utilize supply voltages Vdd_I/O_1, Vdd_I/O_2, and/or Vdd_I/O_3, where the supply voltages may range from approximately 1.5 V to 2.8 V, for example.

The bypass logic block 308 may comprise suitable logic, circuitry, and/or code that may be adapted to provide communication between the host processor 202 in FIG. 2 and at least one peripheral device coupled to the mobile multimedia processor 204. The analog functions block 304 may comprise suitable logic, circuitry, and/or code that may be adapted to generate a plurality of system data signals that may be utilized by the bypass logic and I/O block 302. For example, the system data signals may indicate whether a USB or other external bus is present or whether the bypass mode of operation is to be implemented. At least a portion of the operations in the analog functions block 304 may be powered up by utilizing a supply voltage, such as the Vdd_A voltage, provided via an analog portion of the host interface bus 312.

The core logic block 306 may comprise suitable logic, circuitry, and/or code that may be adapted to perform multimedia processing operations on data, video, and/or audio content provided from either the host processor 202 or from peripheral devices coupled to the mobile multimedia processor 204 via one of the slave busses. The core logic block 306 may operate at about 1.2 V, for example.

In operation, the bypass logic block 308 may become active when the core logic block 306 in the mobile multimedia processor 204 has been powered down or is hibernating, for example. The use of the bypass block 308 enables communication between the host processor 202 and, for example, the LCD 206, without processing information within the mobile multimedia processor 204. In this regard, accessing the mobile multimedia processor 204 may communicate with the host processor 202 via the host bus interface 312 and the mobile multimedia processor 204 may communicate with the LCD 206 via the main bus interface 314 or the secondary bus interface 316, for example. The slave busses may be selected one at a time and the appropriate host bus cycles may be routed through the bypass logic block 308 to the selected slave bus. The bypass logic block 308 may utilize level converters to automatically accommodate the different I/O voltages of the other ports. The bypass logic block 308 may be disabled when the core logic block 306 is in operation. The analog functions block 304 may perform enabling and/or disabling of the bypass logic block 308, for example.

Figure 3B:
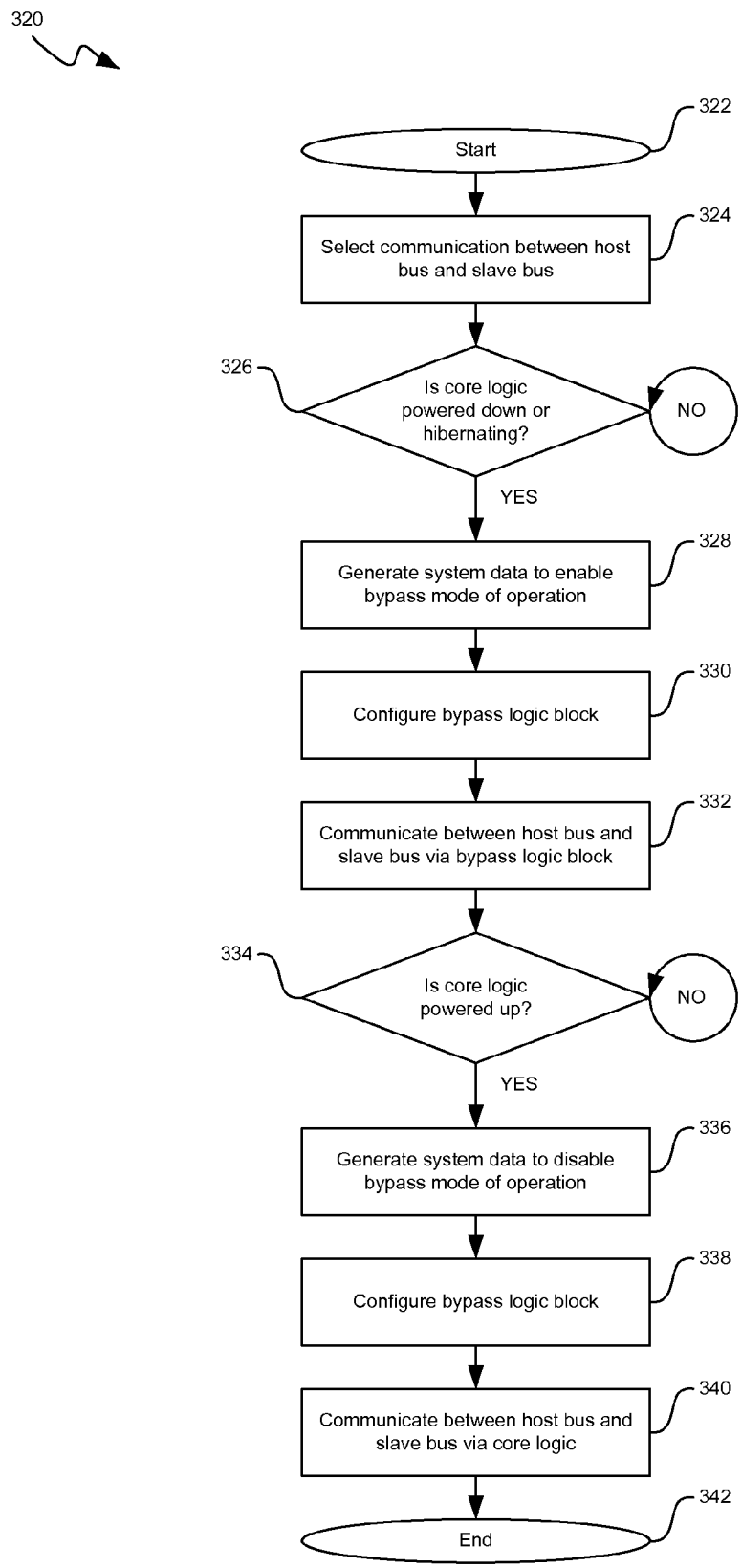
FIG. 3B is a flow diagram illustrating exemplary steps for a bypass mode of operation in a mobile multimedia processor, in accordance with an embodiment of the invention.

FIG. 3B is a flow diagram illustrating exemplary steps for a bypass mode of operation in a mobile multimedia processor, in accordance with an embodiment of the invention. Referring to FIG. 3B, after start step 322, in step 324, communication between the host bus interface 312 in FIG. 3A and either the main bus interface 314 or the secondary bus interface 316 may be selected for the mobile multimedia processor 204. In step 326, the mode of operation of the mobile multimedia processor 204 may be determined. When the core logic block 306 is not powered down or hibernating, the mobile multimedia processor 204 may be operating in a processing mode of operation and the operation remains in step 326. When the core logic block 306 is powered down or hibernating, the mobile multimedia processor 204 may be operating in a bypass mode of operation and the flow diagram 320 may proceed to step 328.

In step 328, the analog functions block 304 may generate system data to enable the bypass mode of operation in the bypass logic block 302. In step 330, the bypass logic block 302 may be configured based on at least a portion of the system data generated by the analog functions block 304 in step 328. In step 332, communication between the host bus interface 312 and the slave bus interface selected in step 324 may be performed via the bypass logic and I/O block 302. In step 334, the mode of operation of the mobile multimedia processor 204 may be determined. When the core logic block 306 is not powered up, the mobile multimedia processor 204 may be operating in the bypass mode of operation, and operation remains in step 334. When the core logic block 306 is powered up, the mobile multimedia processor 204 may be operating in the processing mode of operation and the flow diagram 320 may proceed to step 336.

In step 336, the analog functions block 304 may generate system data to disable the bypass mode of operation in the bypass logic block 302. In step 338, the bypass logic block 302 may be configured based on at least a portion of the system data generated by the analog functions block 304 in step 336. In step 340, communication between the host bus interface 312 and the slave bus interface selected in step 324 may be performed via the core logic block 306. After step 340, the flow diagram 320 may proceed to end step 342.

Figure 4:
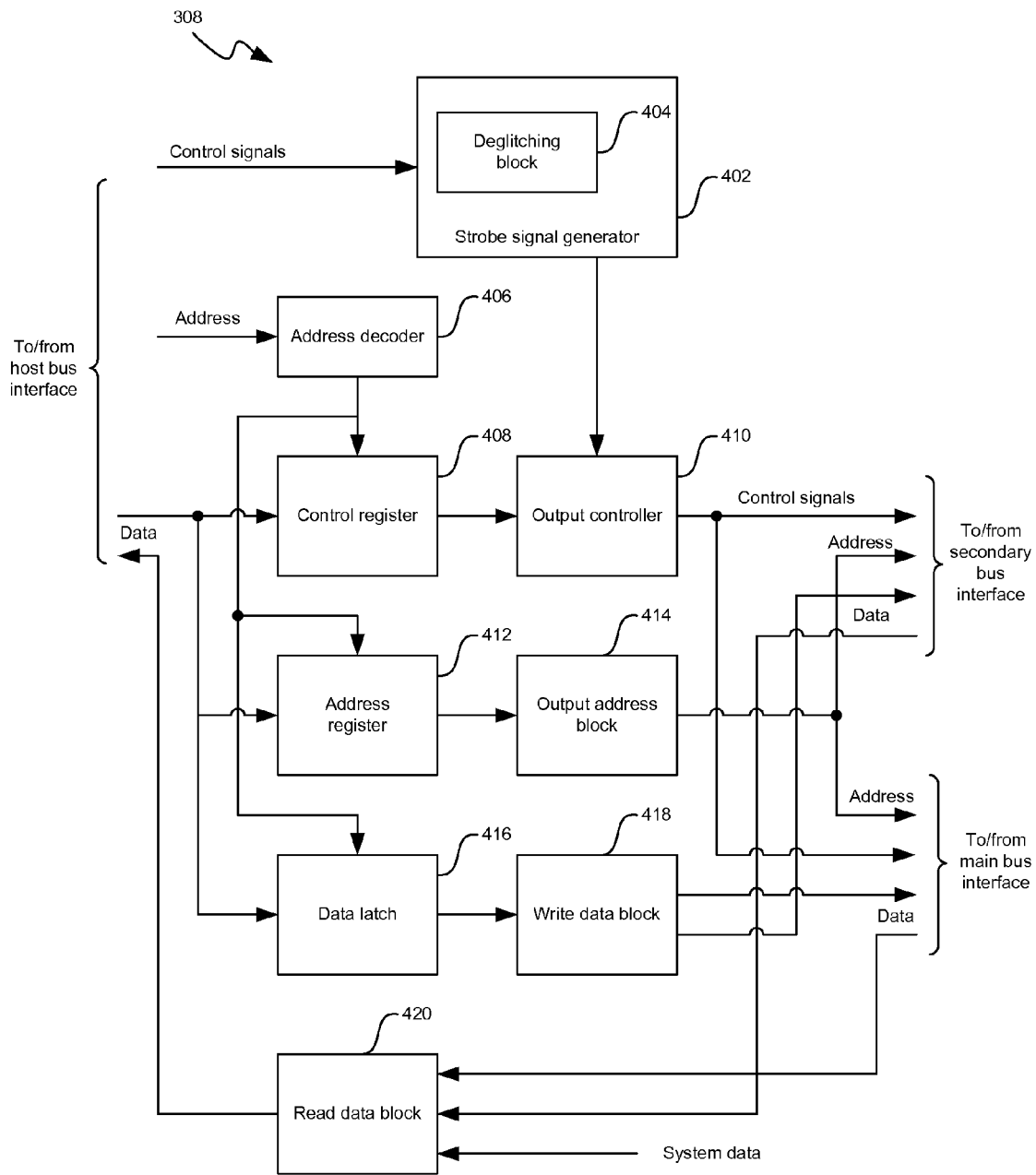
FIG. 4 is a block diagram of exemplary bypass logic functional implementation, in accordance with an embodiment of the invention.

FIG. 4 is a block diagram of exemplary bypass logic functional implementation, in accordance with an embodiment of the invention. Referring to FIG. 4, the bypass logic block 308 in FIG. 3A may comprise a strobe signal generator 402, an address decoder 406, a control register 408, an output controller 410, an address register 412, an output address block 414, a data latch 416, a write data block 418, and a read data block 420. The strobe signal generator 402 may comprise a deglitching block 404.

The address decoder 406 may comprise suitable logic, circuitry, and/or code that may be adapted to receive addressing information from the host processor 202 via the host bus interface 312 and decoding the addressing information. The address decoder 406 may transfer at least a portion of the decoded addressing information to the control register 408, the address register 412, and the data latch 416. The control register 408 may comprise suitable logic, circuitry, and/or code that may be adapted to receive and process data information from the host bus interface 312. The control register 408 may also be adapted to receive decoded addressing information from the address decoder 406 to generate control signals for the slave busses. In this regard, data may refer to content received from the host processor 202. The control register 408 may transfer at least a portion of the processed data and/or processed decoded addressing information to the output controller 410.

The address register 412 may comprise suitable logic, circuitry, and/or code that may be adapted to receive and process data information from the host bus interface 312 and to receive decoded addressing information from the address decoder 406 to generate addressing information for the slave busses. The address register 412 may transfer at least a portion of the processed data and/or processed decoded addressing information to the output address block 414. The data latch 416 may comprise suitable logic, circuitry, and/or code that may be adapted to receive and process data information from the host bus interface 312 and to receive decoded addressing information from the address decoder 406 to generate data information for the slave busses. The data latch 416 may transfer at least a portion of the processed data and/or processed decoded addressing information to the write data block 418. The read data block 420 may comprise suitable logic, circuitry, and/or code that may be adapted to receive and process data information from the secondary bus interface 316 or from the main bus interface 314 and/or to receive system data from the analog functions block 304 to generate data information for the main bus interface 312.

The strobe signal generator 402 may comprise suitable logic, circuitry, and/or code that may be adapted to process control signals received from the host processor 202 via the host bus interface 312. In this regard, the deglitching block 404 may be utilized to reduce the effects of noise, glitches and/or delays that may occur in the leading edge of a strobe or control signal received from the host bus interface 312.

The output controller 410 may comprise suitable logic, circuitry, and/or code that may be adapted to receive the output of the control register 408 and/or the output from the strobe signal generator 402 and generate control signals for the slave busses. The output address bus 414 may comprise suitable logic, circuitry, and/or code that may be adapted to receive the output of the address register 412 and the strobe signal generator 402 and generate addressing information for the slave buses. The write data block 418 may comprise suitable logic, circuitry, and/or code that may be adapted to receive the output of the data latch 416 and the strobe signal generator 402 and generate data information for the slave buses.

In operation, the target slave bus interface may be selected by writing to the control register 408. When the main bus interface 316 is selected, appropriate select signals may be generated to select the device connected to the main bus interface 316. The desired address of the selected slave bus may be written into the address register 412. A slave bus cycle may be initiated by reading from the write data block 418 or writing to the read data block 420. The host bus cycle may be extended through the slave bus via the output controller 410, thereby allowing the host processor 202 to directly access the selected slave device. The host processor 202 may be responsible for ensuring that the bus-timing requirements of the slave device are met. In some instances, the host processor 202 may manually control the signals out to the slave device.

Figure 5A:
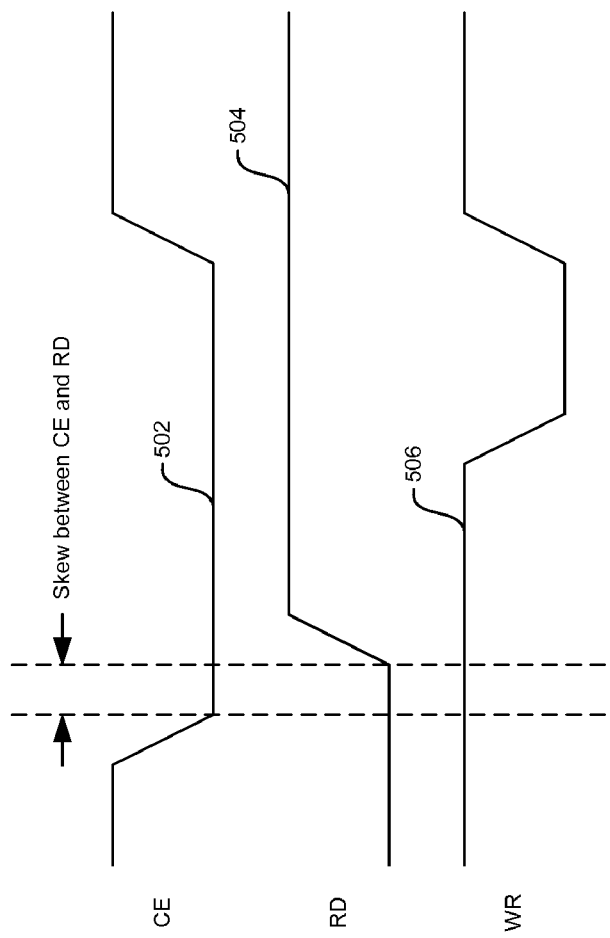
FIG. 5A is a timing diagram that illustrates false bus cycles, in accordance with an embodiment of the invention.

FIG. 5A is a timing diagram that illustrates false bus cycles, in accordance with an embodiment of the invention. Referring to FIG. 5A, there is shown a timing representation of a chip enable (CE) signal 502, a read strobe (RD) signal 504, and a write strobe (WR) signal 506 as may occur in the host bus interface 312 between the host processor 202 and the mobile multimedia processor 204. When the leading edge of the RD signal 504 is delayed, a skew may result between the CE signal 502 and the RD signal 504. This skew may provide a false bus cycle as the RD signal 504 occurs when the CE signal 502 is also asserted. Without the deglitching operation performed by the deglitching block 404 in the strobe signal generator 402, this false bus cycle may be transferred to the peripheral devices connected to the mobile multimedia processor 204.

Figure 5B:
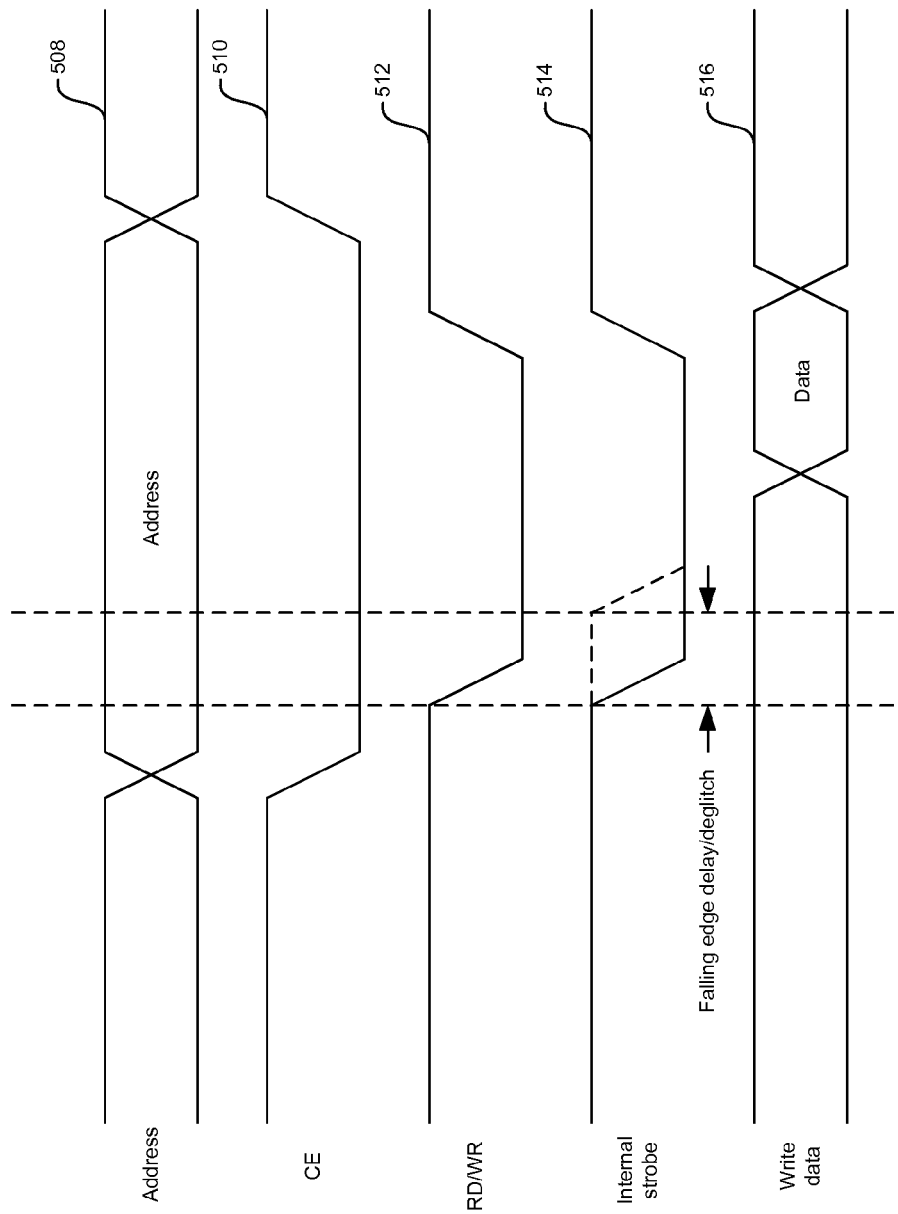
FIG. 5B is a timing diagram that illustrates programmable signal delay and deglitch, in accordance with an embodiment of the invention.

FIG. 5B is a timing diagram that illustrates programmable signal delay and deglitch, in accordance with an embodiment of the invention. Referring to FIG. 5B, there is shown a timing representation of an address signal 508, a chip enable (CE) signal 510, a read (RD) or write (WR) signal 512, an internal strobe signal 514 generated by the strobe signal generator 402, and a write data signal 516. The falling edge of the internal strobe signal 514 may be delayed, for example, to remove noise generated by the host processor 202 that may result in a communication error between the host processor 202 and the selected peripheral device. When resetting the bypass logic block 308, for example, the delay provided by the strobe signal generator 402 may be set to zero and may be dynamically adjusted by programming the strobe signal generator 402 during bypass mode operations.

Figure 6A:
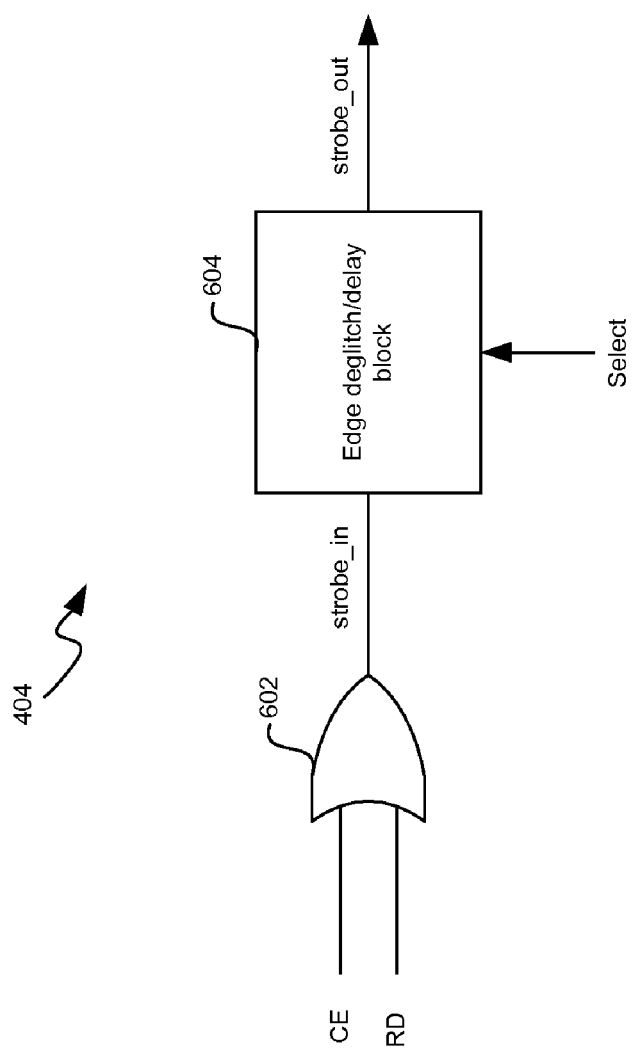
FIG. 6A is a block diagram of an exemplary deglitching circuit, in accordance with an embodiment of the invention.

FIG. 6A is a block diagram of an exemplary deglitching circuit, in accordance with an embodiment of the invention. Referring to FIG. 6A, the deglitching block 404 in FIG. 4 may comprise an OR gate 602 and an edge deglitch/delay block 604. The OR gate 602 may comprise suitable logic and/or circuitry that may be adapted to perform an OR logic operation on a CE signal and a RD signal, for example, to generate a strobe_in signal to the edge deglitch/delay block 604. The edge deglitch/delay block 604 may comprise suitable logic and/or circuitry that may be adapted to receive the strobe_in signal and generate a delayed strobe_out signal. The edge deglitch/delay block 604 may utilize a select signal to determine the delay to be applied to the strobe in signal.

Figure 6B:
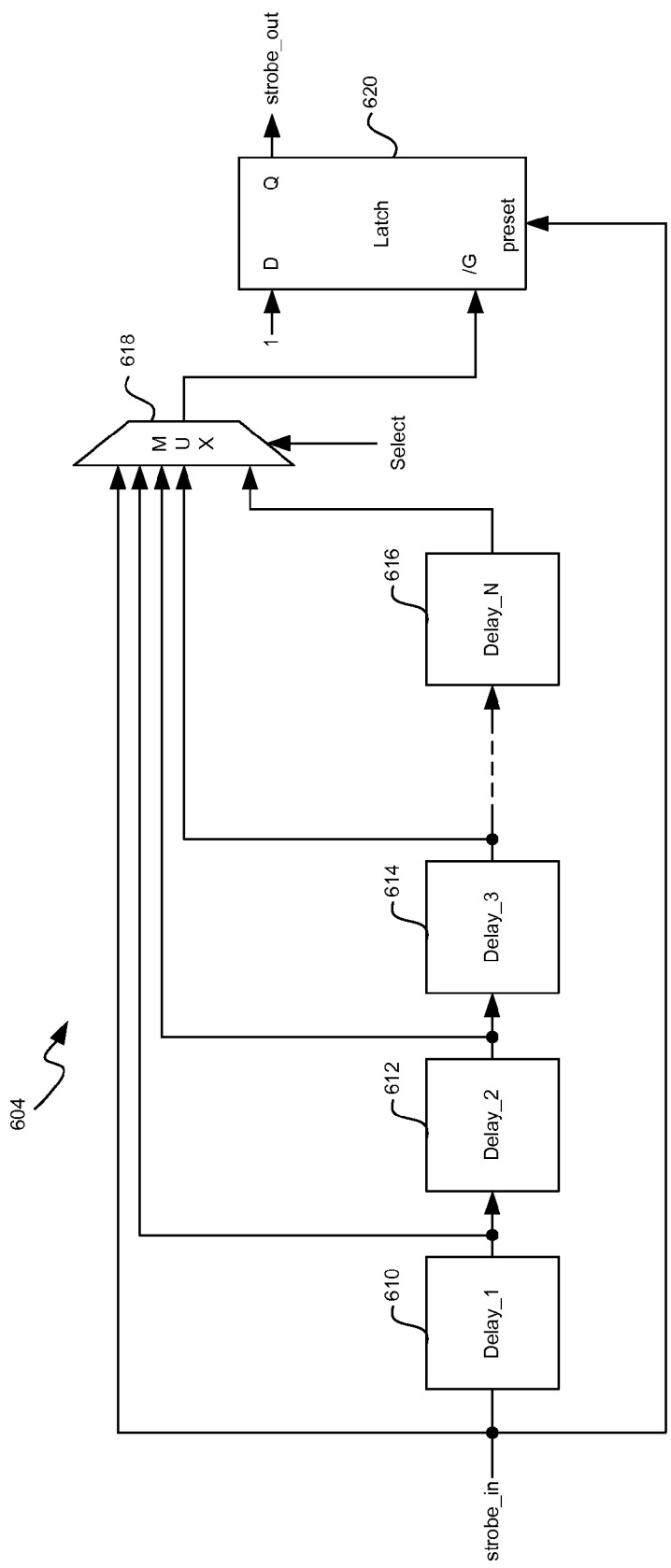
FIG. 6B is a block diagram of an exemplary edge deglitch/delay block in a deglitching circuit, in accordance with an embodiment of the invention.

FIG. 6B is a block diagram of an exemplary edge deglitch/delay block in a deglitching circuit, in accordance with an embodiment of the invention. Referring to FIG. 6B, the edge deglitch/delay block 604 in FIG. 6A may comprise N delay cells delay_1 610 to delay_N 616, a multiplexer (MUX) 618, and a latch 620. The delay cells may comprise suitable logic, and/or circuitry that may be adapted to provide a time delay. For example, the delay_1 610 may receive the strobe_in signal and may provide a delayed version of the strobe_in signal at its output. The delay_2 612 may then receive the delayed strobe_in signal from the delay_1 610 and may provide an additional delay. In some instances, the number N of delay cells may vary, that is, different implementations may utilize different number of delay cells. Moreover, the delay cells may have different or similar time delay effects based on the type of delay elements utilized in each delay cell.

The MUX 618 may comprise suitable logic, circuitry, and/or code that may be adapted to select the time delay to be applied to the strobe in signal. In this regard, the MUX 618 selects from the outputs of the delay cells to achieve the time delay desired. A select signal may be utilized to dynamically select the desired time delay. The latch 620 may comprise suitable logic and/or circuitry that may be adapted to latch the output of the MUX 618 to generate the strobe_out signal. The strobe_in signal may be utilized to preset the latch 620, for example.

In operation, the strobe_in signal is received by the edge deglitch/delay block 604 and may propagate through the delay cells. Once the strobe_in signal has propagated through at least one of the delay cells, the select signal may be utilized to select between the strobe_in signal or a time-delayed version of the strobe_in signal. For example, the select signal may be utilized to select the strobe_in signal with no cell delay as the output of the MUX 618. In another example, the select signal may be utilized to select a time-delayed version of the strobe_in signal as the output of the MUX 618 by selecting from among the outputs of the delay cells. In either case, there may be a minimal delay introduced by the propagation of signals through the MUX 618 and by the operation of the latch 620.

Figure 7A:
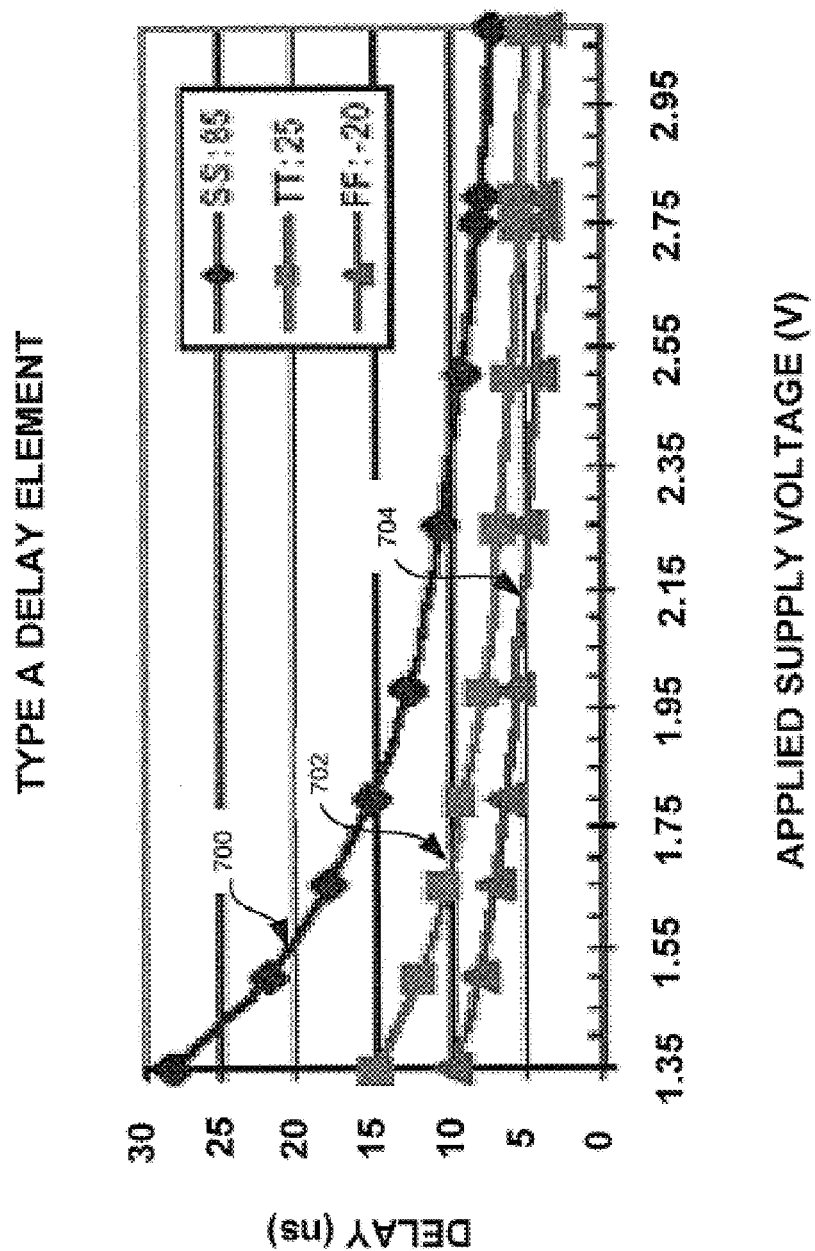
FIGS. 7A-7B illustrate graphs of the time delay provided by a first delay element type and a second delay element type at various temperatures and supply voltages, in accordance with an embodiment of the invention.
Figure 7B:
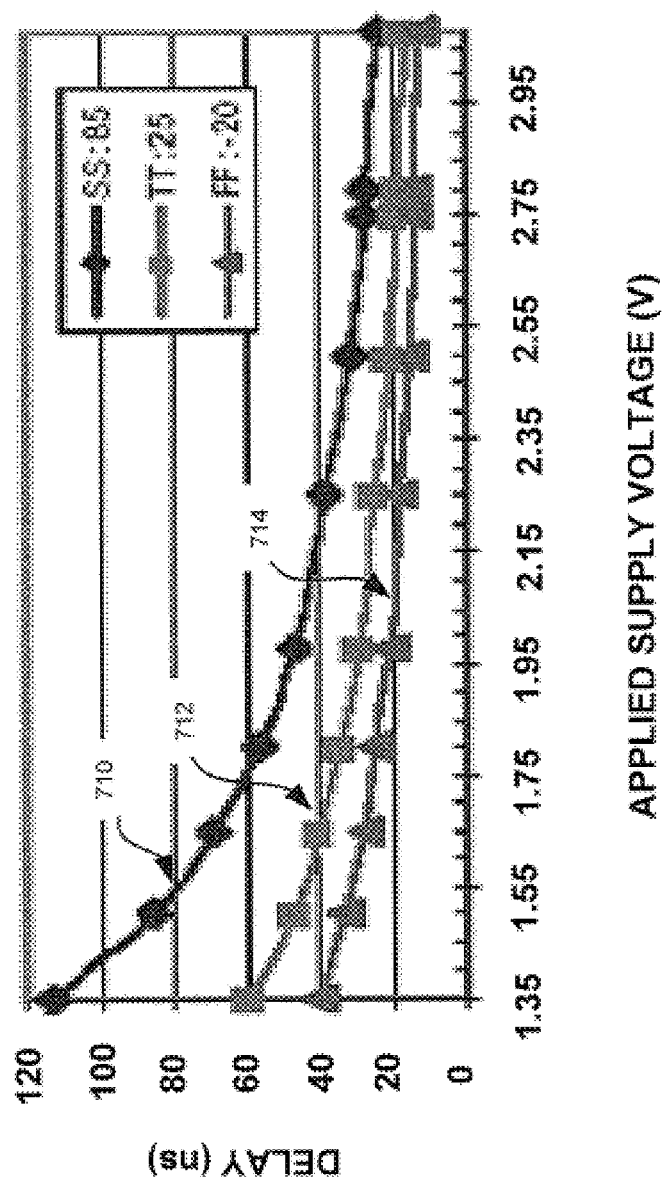

FIGS. 7A-7B illustrate graphs of the time delay provided by a first delay element type and a second delay element type at various temperatures and supply voltages, in accordance with an embodiment of the invention. Referring to FIG. 7A, there is shown a time delay graph of the time delay interval provided by a type A element in a delay cell over an applied supply voltage range between about 1.35 V and 3.08V and over a temperature range between about −20 degrees Celsius (C) and 85° C. For example, the line plot 700 may represent the time delays in nanoseconds (ns) provided by a type A delay element in a delay cell at about 85° C. over the supply voltage range. Similarly, line plots 702 and 704 may represent the respective time delays provided by a type A delay element in a delay cell at about 25° C. and −20° C. over the supply voltage range.

Referring to FIG. 7B, there is shown a time delay graph of the time delay interval provided by a type B element in a delay cell over an applied supply voltage range between about 1.35 V and 3.08V and over a temperature range between about −20° C. and 85° C. For example, the line plot 710 may represent the time delays in nanoseconds (ns) provided by a type B delay element in a delay cell at about 85° C. over the supply voltage range. Similarly, line plots 712 and 714 may represent the respective time delays provided by a type B delay element in a delay cell at about 25° C. and −20° C. over the supply voltage range.

A type A element or a type B element may be utilized in a delay cell as shown in FIG. 6B to provide a time delay to the strobe_in signal and/or to delayed versions of the strobe_in signal. In this regard, the selection of a type A element or a type B element in a delay cell and the selection of the number of delay cells necessary to provide the appropriate time delay may be based on the operating conditions of the mobile multimedia processor 204. There may be instances where the time delay may be generated by a combination of at least one delay cell comprising a type A element and at least one delay cell comprising a type B element. Moreover, there may be instances where a single delay cell may comprise more than one delay element. While type A element results and type B elements results have been described herein, embodiments of the edge deglitch/delay block 604 need not be so limited.

In addition to providing a deglitching mechanism that supports high-speed communication when bypassing the core logic 306 in the mobile multimedia processor 204, the implementation of the input, output, and/or bidirectional pads in the host bus interface 312, the main bus interface 314, and/or the secondary bus interface 316 may be adapted to provide bypass mode support.

Figure 8A:
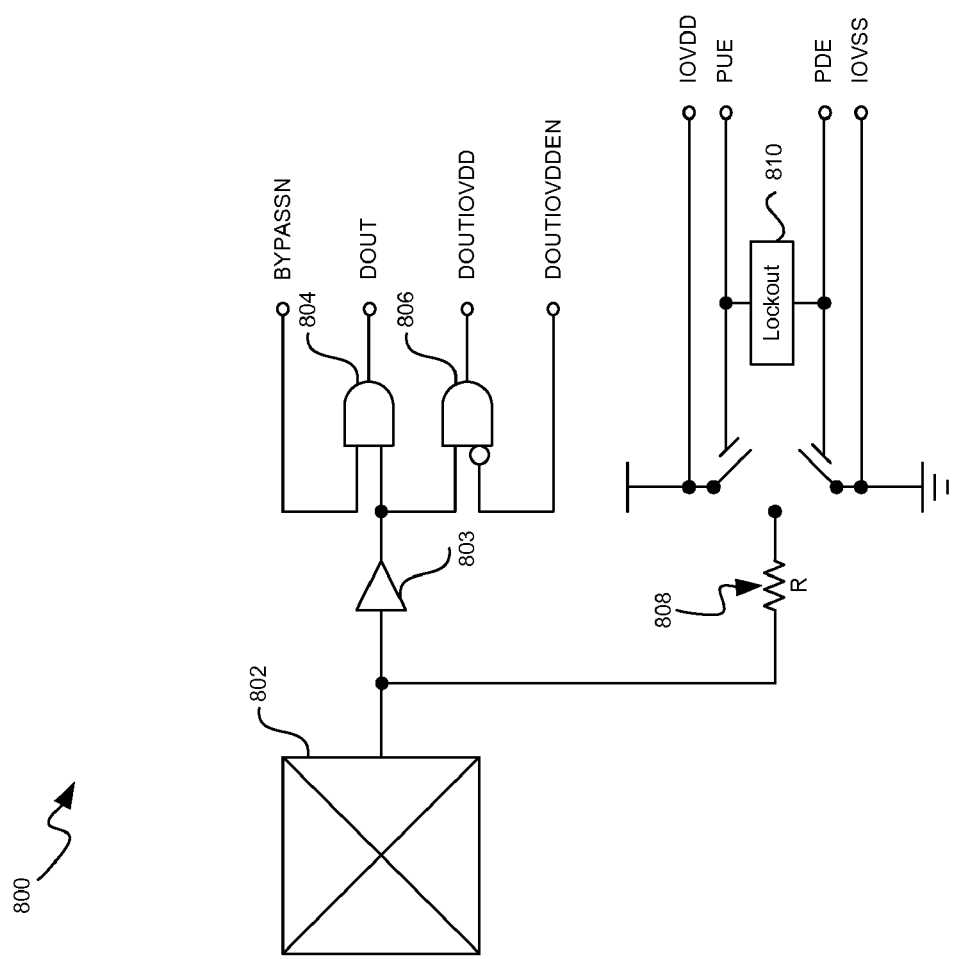
FIG. 8A is a block diagram of an exemplary input pad for a mobile multimedia processor with bypass capabilities, in accordance with an embodiment of the invention.

FIG. 8A is a block diagram of an exemplary input pad for a mobile multimedia processor with bypass capabilities, in accordance with an embodiment of the invention. Referring to FIG. 8A, an input pad system 800 may comprise a contact pad 802, an input buffer 803, AND gates 804 and 806, a resistor (R) 808, and a lockout block 810. The contact pad 802 may comprise suitable hardware that may be utilized for connecting a signal from an external device with internal circuitry within the mobile multimedia processor 204, for example, the core logic block 306, or with other external devices via the bypass logic block 308 in the mobile multimedia processor 204. For example, the contact pad 802 may be utilized to receive information from devices coupled to the host bus interface 312, the main bus interface 314, and/or the secondary bus interface 316. The input buffer 803 may comprise suitable logic and/or circuitry that may be adapted to provide the necessary current drive to transfer information to the inputs of the AND gate 804 and the AND gate 806. In this regard, the input buffer 803 may be based on the capacitative load provided by the inputs to the AND gate 804 and the AND gate 806. In some instances, the input buffer 803 may comprise more than one inverter to provide sufficient current drive. In this regard, when the driven device, for example, the AND gate 804 or the AND gate 806 in FIG. 8A, are far from the contact pad 802, the input buffer 803 may need to be adapted to provide more current drive.

The resistor R 808 may be, for example, about 30 Ohms and may be utilized to provide pull-up (PU) or pull-down (PD) capabilities on the contact pad 802. A pull-up enable (PUE) or a pull-down enable (PDE) signal may be utilized to connect the contact pad 802 to supply (IOVDD) or ground (IOVSS) respectively. Pull-up and pull-down operations may be programmable, for example. In some instances, the PUE may be tied to the IOVDD and the PDE may be tied to the IOVSS. The lockout block 810 may comprise suitable logic and/or circuitry that may be adapted to prevent concurrent operation of the pull-up and pull-down capabilities in the input pad system 800.

The AND gate 804 may comprise suitable logic and/or circuitry that may be adapted to perform a logic AND operation on a bypass selection signal (BYPASSN) and the input signal from the contact pad 802. When BYPASSN is high, for example, the output DOUT of the AND gate 804 is the input signal from the contact pad 802. In this regard, the output DOUT may be connected to the core logic block 306, for example. The AND gate 806 may comprise suitable logic and/or circuitry that may be adapted to perform a logic AND operation on an inverse of a core processing enable signal (DOUTIOVDDEN) and the input signal from the contact pad 802. When DOUTIOVDDEN is low, the output DOUTIOVDD of the AND gate 806 is the input signal from the contact pad 802. In this regard, the output DOUTIOVDD may be connected to the bypass logic block 308, for example.

Figure 8B:
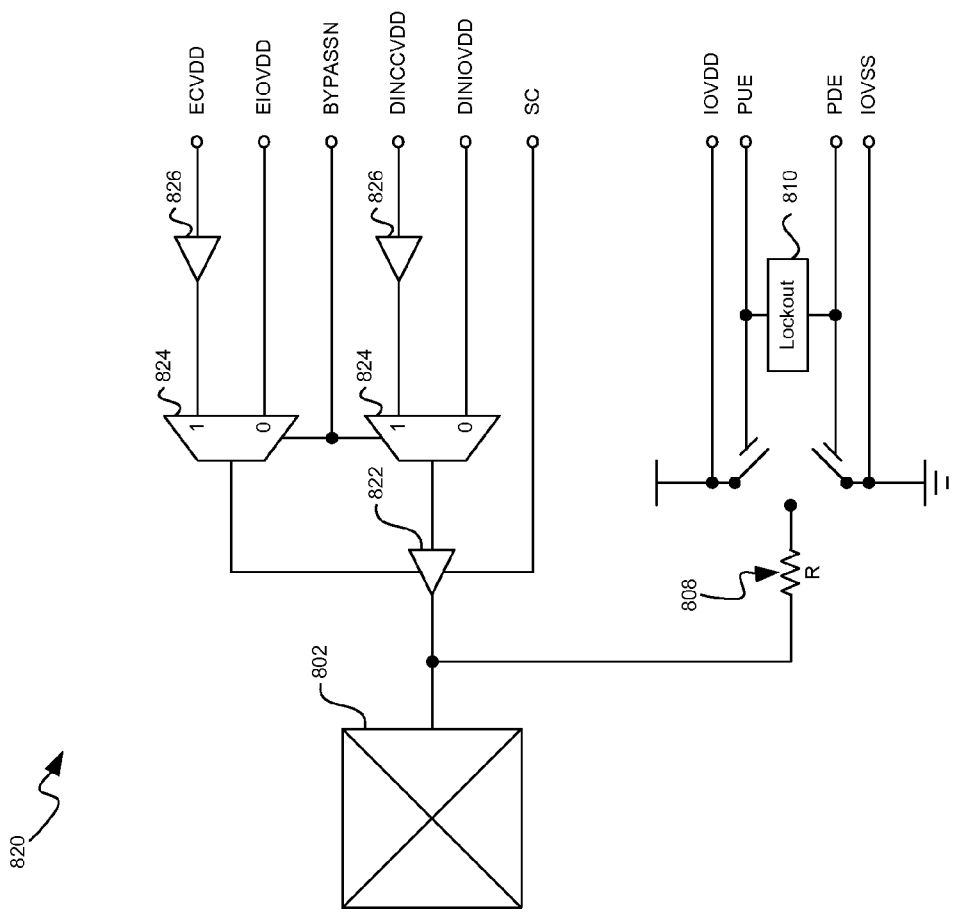
FIG. 8B is a block diagram of an exemplary output pad for a mobile multimedia processor with bypass capabilities, in accordance with an embodiment of the invention.

FIG. 8B is a block diagram of an exemplary output pad for a mobile multimedia processor with bypass capabilities, in accordance with an embodiment of the invention. Referring to FIG. 8B, an output pad system 820 may be a tristable pad and may comprise a contact pad 802, an output buffer 822, multiplexers 824, buffers 826, the R 808, and the lockout block 810. The contact pad 802, the resistor 808, and the lockout block 810 may be substantially similar to those described in FIG. 8A. The output buffer 822 may comprise suitable logic and/or circuitry that may be adapted to provide the necessary current drive to transfer information to the contact pad 802. In this regard, the output buffer 822 may be based on the capacitative load provided to the contact pad 802. In some instances, the output buffer 822 may comprise more than one inverter to provide sufficient current drive. The drive strength select (SC) signal may be utilized to modify the driving provided by the output buffer 822. The bypass selection signal (BYPASSN) may be utilized to select an output signal driven from the core logic block 306 and based on signals ECVDD and DINCVDD or from the bypass logic block 308 and based on signals EIOVDD and DINIOVDD. The buffers 826 may comprise suitable logic and/or circuitry that may be adapted to level shift the output signals.

Figure 8C:
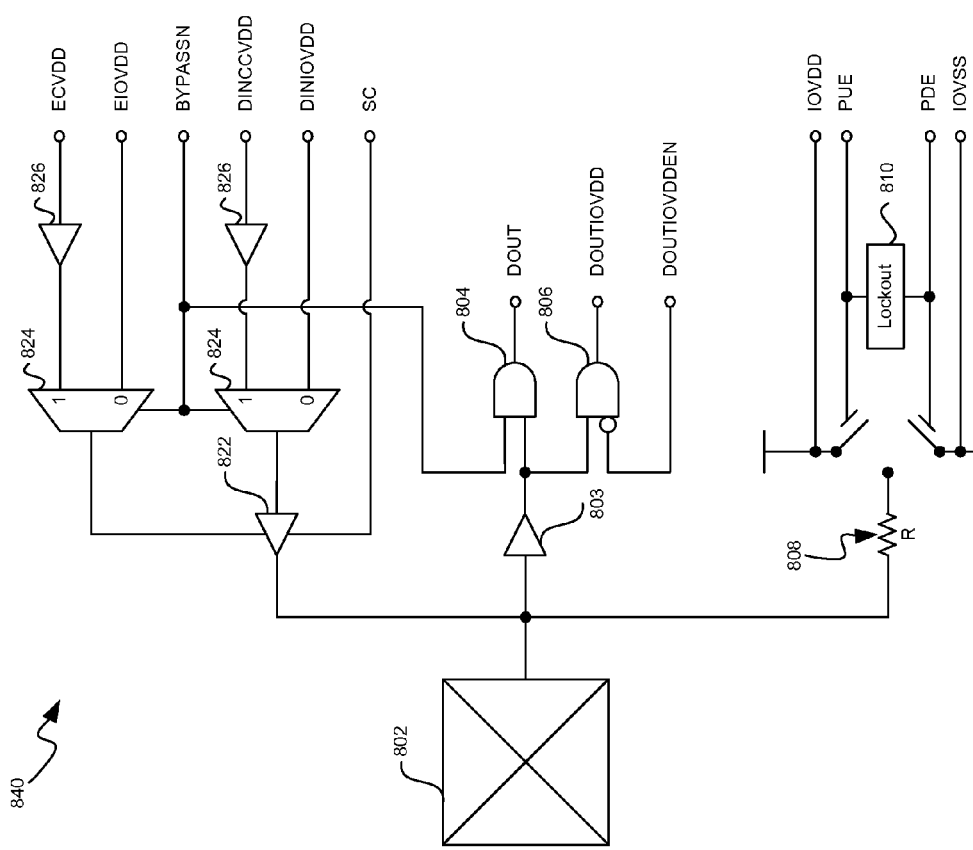
FIG. 8C is a block diagram of an exemplary bidirectional pad for a mobile multimedia processor with bypass capabilities, in accordance with an embodiment of the invention.

FIG. 8C is a block diagram of an exemplary bidirectional pad for a mobile multimedia processor with bypass capabilities, in accordance with an embodiment of the invention. Referring to FIG. 8C, the bidirectional pad system 840 may comprise portions of the logic and/or circuitry of the input pad system 800 that may be utilized to drive signals received from the contact pad 802 to the core logic block 306 or the bypass logic block 308. Moreover, the bidirectional pad system 840 may also comprise portions of the logic and/or circuitry of the output pad system 820 that may be utilized to drive signals received from the core logic block 306 or the bypass logic block 308 to the contact pad 802. The bidirectional pad system 840 may also comprise suitable logic as described in FIGS. 8A-8B to provide selectable pull-up or pull-down of a contact pad potential.

In addition to operating in a bidirectional mode, the bidirectional pad system 840 may also be operated in an input mode or an output mode. In the input mode, the bidirectional pad system 840 may operate substantially as the input pad system 800 by utilizing the appropriate control signals. In the output mode, the bidirectional pad system 840 may operate substantially as the output pad system 820 by utilizing the appropriate control signals. Whether operated in the bidirectional mode, the input mode, or the output mode, the bidirectional pad system 840 may support the bypass mode or processing mode of operation.

Figure 8D:
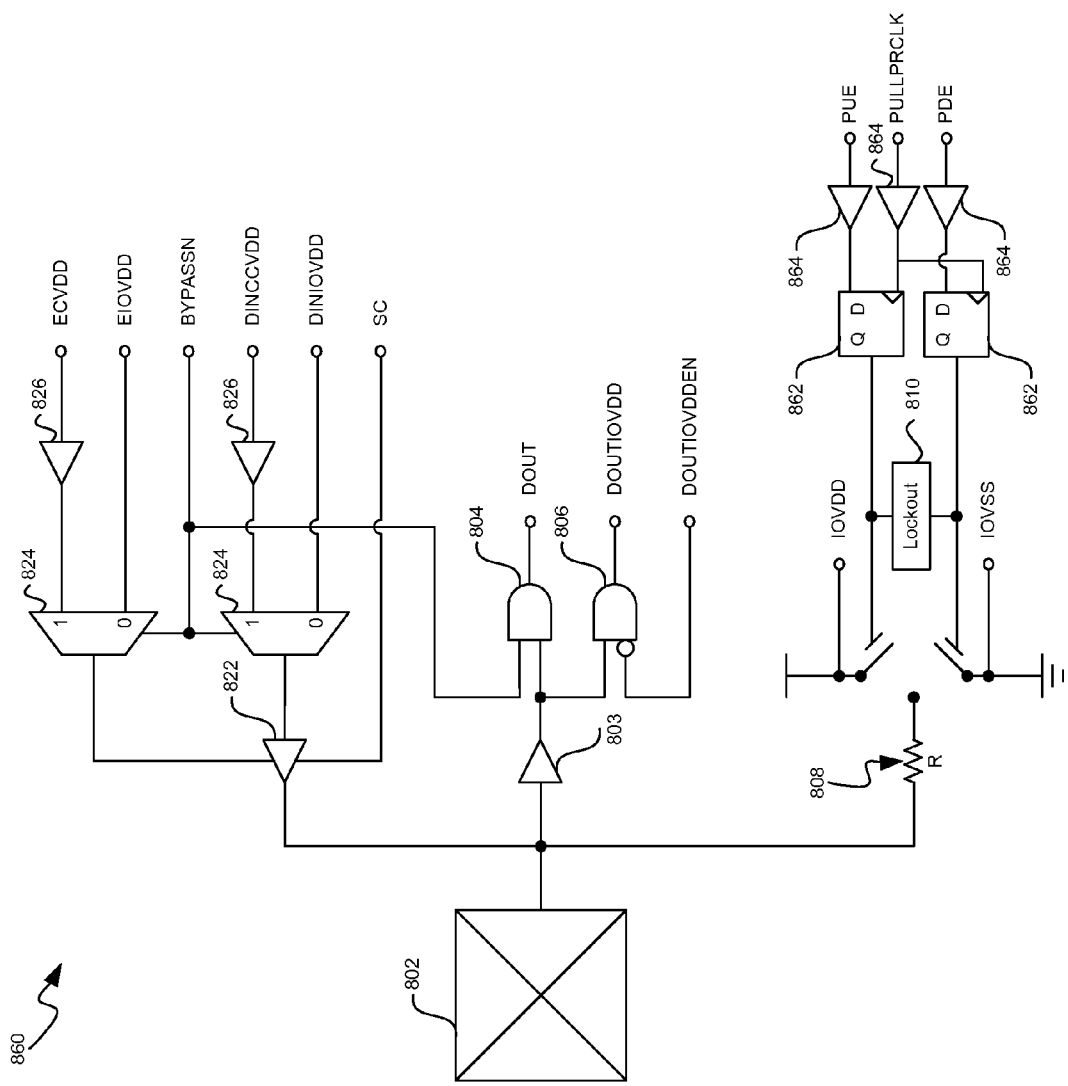
FIG. 8D is a block diagram of an exemplary bidirectional pad with programmable pulling resistors for a mobile multimedia processor with bypass capabilities, in accordance with an embodiment of the invention.

FIG. 8D is a block diagram of an exemplary bidirectional pad with programmable pulling resistors for a mobile multimedia processor with bypass capabilities, in accordance with an embodiment of the invention. Referring to FIG. 8D, a bidirectional pad system 860 may differ from the bidirectional pad system 840 in FIG. 8C in that the pull-up and pull-down capabilities may be programmable. In this regard, the bidirectional pad system 860 may comprise programming buffers 864 and D flip-flops 862. The programming buffers 864 may comprise suitable logic and/or circuitry that may be adapted to level shift of the PUE and PDE signals and the clocking signal (PULLPRCLK). The PULLPRCLK signal may be utilized to clock the PUE and PDE signals to the D flip-flops 862 to select either pull-down or pull-up capabilities.

In some instances, a bank of pads comprising a plurality of output and/or bidirectional pads may automatically measure the supply voltage in the bank and may adapt the driving capabilities of the output pads and/or the bidirectional pads to provide suitable rise and fall times. Input, output, and/or bidirectional pads may be rated for use at a specified voltage range, for example, about 1.5 V to 2.8 V. In this regard, the voltages in the range may have a tolerance value of, for example, about ±10%.

Figure 9:
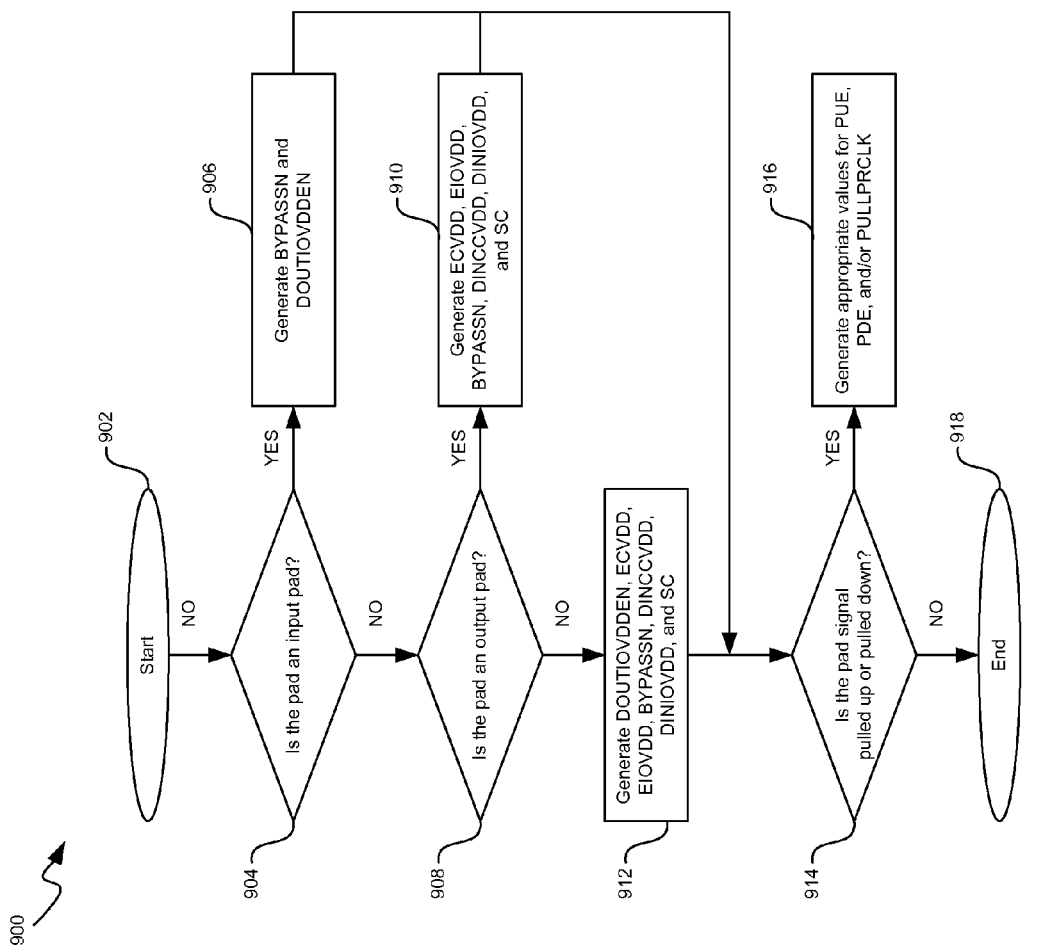
FIG. 9 is a flow diagram illustrating exemplary steps in the configuration of signal pads in a mobile multimedia processor, in accordance with an embodiment of the invention.

FIG. 9 is a flow diagram illustrating exemplary steps in the configuration of signal pads in a mobile multimedia processor, in accordance with an embodiment of the invention. Referring to FIG. 9, after start step 902, in step 904, a determination is made as to whether a pad to be configured in either the host bus interface 312, the main bus interface 314, or the secondary bus interface 316 is an input pad. When the pad to be configured is an input pad, the signals BYPASSN and DOUTIOVDDEN may be generated in step 906 in accordance to whether the mobile multimedia processor 204 is operating in a bypass mode of operation or a processing mode of operation. When the pad to be configured is not an input pad, the flow diagram 900 may proceed to step 908.

In step 908, a determination is made as to whether the pad to be configured is an output pad. When the pad to be configured is an output pad, the signals ECVDD, EIOVDD, BYPASSN, DINCCVDD, DINIOVDD, and SC may be generated in step 910 in accordance to whether the mobile multimedia processor 204 is operating in a bypass mode of operation or a processing mode of operation. When the pad to be configured is not an output pad, the pad to be configured is a bidirectional pad and the flow diagram 900 may proceed to step 912. In step 912, for programmable and non-programmable bidirectional pads, the signals DOUTIOVDDEN, ECVDD, EIOVDD, BYPASSN, DINCCVDD, DINIOVDD, and SC may be generated.

In step 914, a determination is made as to whether the configured pad is to be pulled up to IOVDD or pulled down to IOVSS. In this regard, the value of IOVDD and IOVSS may depend on the bus interface in which the pad is located. When the configured pad is to be pulled up or pulled down, the flow diagram 900 may proceed to step 916 where the appropriate values of PUE, PDE, and/or PULLPRCLK may be generated. For a programmable bidirectional pad as described in FIG. 8D, the signal PULLPRCLK may be utilized to program a pull-up to IOVDD or a pull-down to IOVSS of the pad. When the configured pad is not to be pulled up or pulled down, the flow diagram 900 may proceed to end step 918.

The approach described herein provides a flexible architecture that enables high-speed bypass communications between a host processor and a peripheral device via a mobile multimedia processor.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. A method for communicating signals, the method comprising:
   receiving data from a host device in an integrated circuit having at least one contact pad integrated thereon; and
   generating at least one control signal that controls said at least one contact pad wherein:
   when said received data is to be processed by a mobile multimedia processor (MMP), allowing said received data to be processed by said MMP based on said generated at least one control signal; and
   when said received data is to be passed through said MMP without being processed by said MMP, enabling a bypass mode based on said generated at least one control signal thereby allowing said received data to pass through said MMP to an external memory via said at least one contact pad without being processed by said MMP, thereby sharing said external memory with said host device.

2. The method according to claim 1, comprising transferring said received data to said external memory coupled to at least one other contact pad on said MMP when said received data is to be passed through said MMP.

3. The method according to claim 1, further comprising processing said received data by a processing circuitry in said MMP when said received data is to be processed by said MMP.

4. The method according to claim 1, comprising generating at least one additional control signal to pull-down a potential of said at least one contact pad.

5. The method according to claim 1, comprising generating at least one additional control signal to pull-up a potential of said at least one contact pad.

6. A method for communicating signals via an integrated circuit, the method comprising:
generating at least one control signal that controls at least one contact pad integrated on a mobile multimedia processor (MMP) in an integrated circuit wherein:
when output data received from a host device was processed by said MMP, allowing transfer of said output data to an external device based on said generated at least one control signal; and
when said output data has been passed through said MMP without being processed by said MMP, enabling a bypass mode based on said generated at least one control signal thereby allowing transfer of said output data to external memory; and
transferring said output data to said external memory via said at least one contact pad integrated on said MMP, thereby sharing said external memory with said host device.

7. The method according to claim 6, comprising generating at least one additional control signal to pull-down a potential of said at least one contact pad.

8. The method according to claim 6, comprising generating at least one additional control signal to pull-up a potential of said at least one contact pad.

9. A system for communicating signals, the system comprising:
at least one contact pad integrated on a mobile multimedia processor (MMP) that receives data from a host device; and
one or more circuits within an integrated circuit, said one or more circuits comprising said MMP, wherein said one or more circuits are operable to generate at least one control signal that controls operation of said at least one contact pad wherein:
when said received data is to be processed by said MMP, allowing said received data to be processed by said MMP based on said generated at least one control signal; and
when said received data is to be passed through said MMP without being processed by said MMP, enabling a bypass mode based on said generated at least one control signal thereby allowing said received data to pass through said MMP to an external memory via said at least one contact pad without being processed by said MMP, thereby sharing said external memory with said host device.

10. The system according to claim 9, wherein said one or more circuits are operable to transfer said received data to said external memory coupled to at least one other contact pad on said MMP when said received data is to be passed through said MMP.

11. The system according to claim 9, wherein said one or more circuits comprises circuitry within said MMP that is operable to process said received data when said received data is to be processed by said MMP.

12. The system according to claim 9, wherein said one or more circuits are operable to generate at least one additional control signal to pull-down a potential of said at least one contact pad.

13. The system according to claim 9, wherein said one or more circuits are operable to generate at least one additional control signal to pull-up a potential of said at least one contact pad.

14. A system for communicating signals, the system comprising:
one or more circuits comprising a mobile multimedia processor, and said one or more circuits are integrated within an integrated circuit, wherein said one or more processors are operable to generate at least one control signal that is operable to control at least one contact pad integrated on said mobile multimedia processor (MMP) wherein:
when an output data received from a host device was processed by said MMP, allowing transfer of said output data to an external device based on said generated at least one control signal; and
when said output data has been passed through said MMP without being processed by said MMP, enabling a bypass mode based on said generated at least one control signal thereby allowing transfer of said output data to said memory device; and
said one or more circuits are operable to transfer said output data to said memory device via said at least one contact pad integrated on said MMP, thereby sharing said external memory with said host device.

15. The system according to claim 14, wherein said one or more circuits are operable to generate at least one additional control signal to pull-down a potential of said at least one contact pad.

16. The system according to claim 14, wherein said one or more circuits are operable to generate at least one additional control signal to pull-up a potential of said at least one contact pad.

* * * * *